(12) United States Patent
Cao et al.

(10) Patent No.: US 10,546,940 B2
(45) Date of Patent: Jan. 28, 2020

(54) ON-CHIP INTEGRATED TEMPERATURE PROTECTION DEVICE BASED ON GEL ELECTROLYTE

(71) Applicant: INTERNATIONAL BUSINESS MACHINES CORPORATION, Armonk, NY (US)

(72) Inventors: Qing Cao, Yorktown Heights, NY (US); Kangguo Cheng, Schenectady, NY (US); Zhengwen Li, Chicago, IL (US); Fei Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 15/258,347

(22) Filed: Sep. 7, 2016

(65) Prior Publication Data

US 2018/0068925 A1    Mar. 8, 2018

(51) Int. Cl.
*H01L 29/66* (2006.01)
*H01L 29/51* (2006.01)

(52) U.S. Cl.
CPC ........ *H01L 29/66477* (2013.01); *H01L 29/51* (2013.01)

(58) Field of Classification Search
CPC .................................................. H01L 23/3737
See application file for complete search history.

(56) References Cited

U.S. PATENT DOCUMENTS

| | | | |
|---|---|---|---|
| 5,070,322 A | 12/1991 | Fujihira | |
| 5,873,053 A | 2/1999 | Pricer et al. | |
| 6,893,154 B2 | 5/2005 | Gold et al. | |
| 7,127,368 B2 | 10/2006 | Choi | |
| 7,891,865 B2 | 2/2011 | Clark, Jr. et al. | |
| 8,203,138 B2 | 6/2012 | Takeya et al. | |
| 8,419,274 B2 | 4/2013 | Chen et al. | |
| 8,927,967 B2 | 1/2015 | Dasgupta et al. | |
| 9,074,942 B2 | 7/2015 | Chowdhury et al. | |
| 2009/0039343 A1 | 2/2009 | Kugler | |
| 2009/0122465 A1* | 5/2009 | Lin | H01L 29/78681 361/434 |
| 2012/0081774 A1* | 4/2012 | De Paiva Martins | H01L 45/1206 359/265 |
| 2015/0037827 A1* | 2/2015 | Dastoor | G01N 27/4145 435/14 |

(Continued)

OTHER PUBLICATIONS

Dhoot, A.S. et al., "Beyond the metal-insulator transition in polymer electrolyte gated polymer field-effect transistors" PNAS (Aug. 2008) pp. 11834-11837, vol. 103, No. 32.

(Continued)

*Primary Examiner* — Marc Anthony Armand
(74) *Attorney, Agent, or Firm* — Tutunjian & Bitetto, P.C.; Vazken Alexanian

(57) ABSTRACT

A field effect transistor includes an exposed channel region disposed between a source region and a drain region. A gate electrode is disposed over the exposed channel region. An electrolyte gel is disposed between the gate electrode and the exposed channel region, wherein ions are immobilized in the electrolyte gel below a transition temperature and mobilized above the transition temperature to increase device resistance.

20 Claims, 5 Drawing Sheets

(56) References Cited

U.S. PATENT DOCUMENTS

2018/0024092 A1* 1/2018 Haque .................. G01N 27/414

OTHER PUBLICATIONS

Lu, C. et al., "Polymer Electrolyte-Gated Carbon Nanotube Field-Effect Transistor" Nano Letters (2004) pp. 623-627, vol. 4, No. 4.

Shih, Y.-H. et al., "High Sensitive and Wide Detecting Range MOS Tunneling Temperature Sensors for On-Chip Temperature Detection" IEEE Transactions on Electron Devices (Sep. 2004) pp. 1514-1521, vol. 51, No. 9.

Park, Y.D. et al., "Polyelectrolyte Interlayer for Ultra-Sensitive Organic Transistor Humidity Sensors" ACS (Aug. 2013) pp. 8591-8596, vol. 5.

Carrad, D.J. et al., "Electron-beam patterning of polymer electrolyte films to make multiple nanoscale gates for nanowire transistors" Nano letters (Dec. 2013) pp. 94-100, vol. 14, No. 1.

Lin, M.-W. et al., "Mobility enhancement and highly efficient gating of monolayer MoS2 transistors with Polymer Electrolyte" J. of Phys. D: Applied Physics (Oct. 2012) pp. 1-17, vol. 45, No. 34.

\* cited by examiner

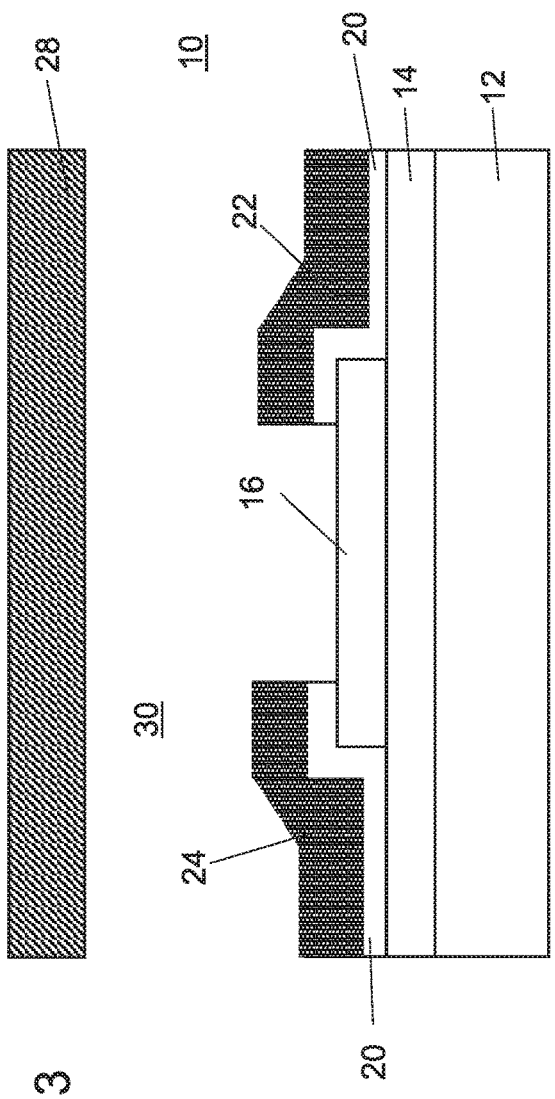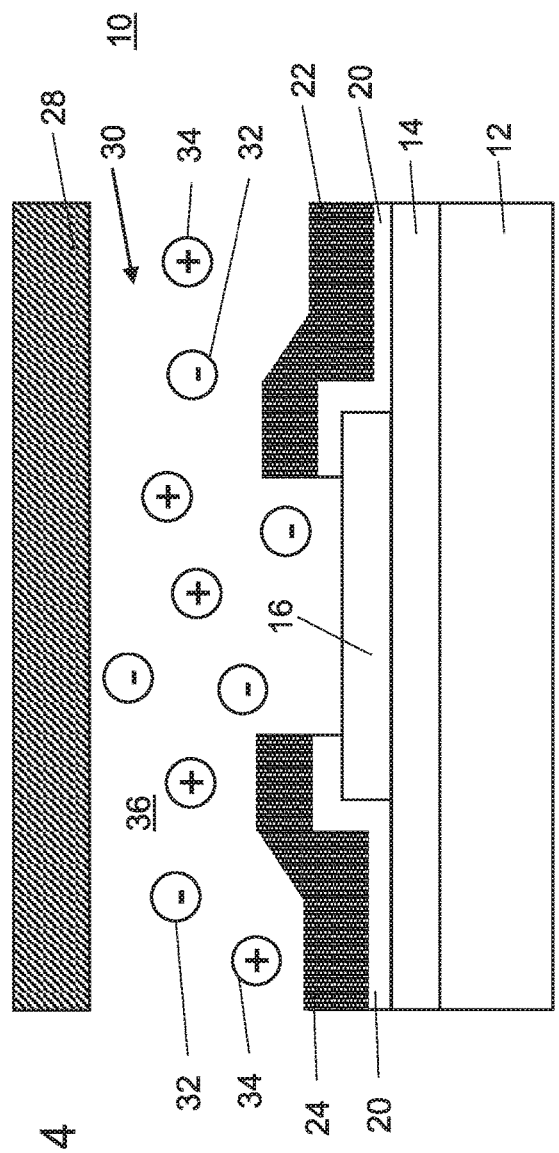

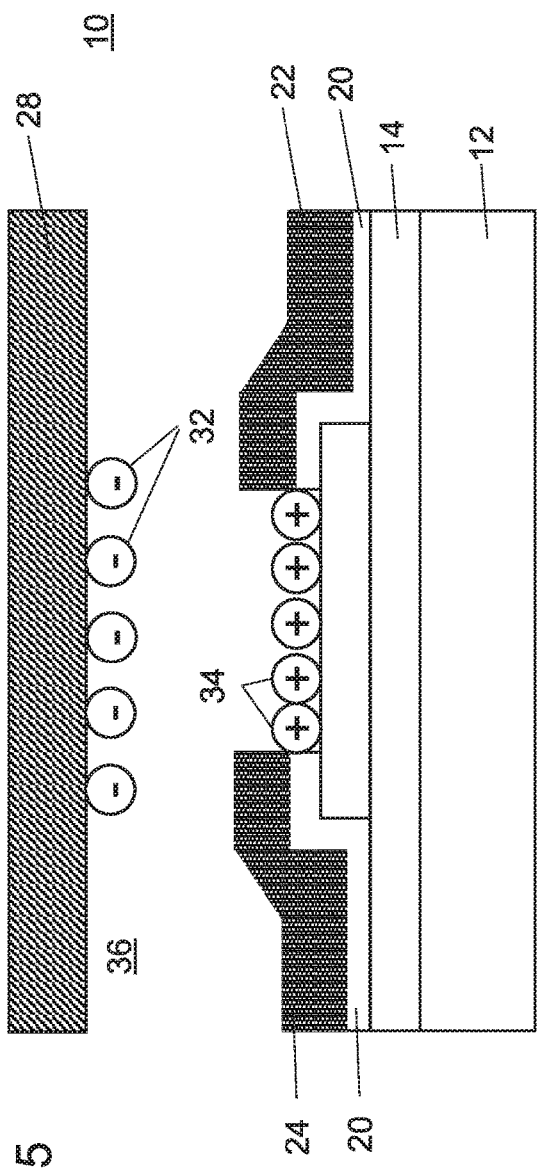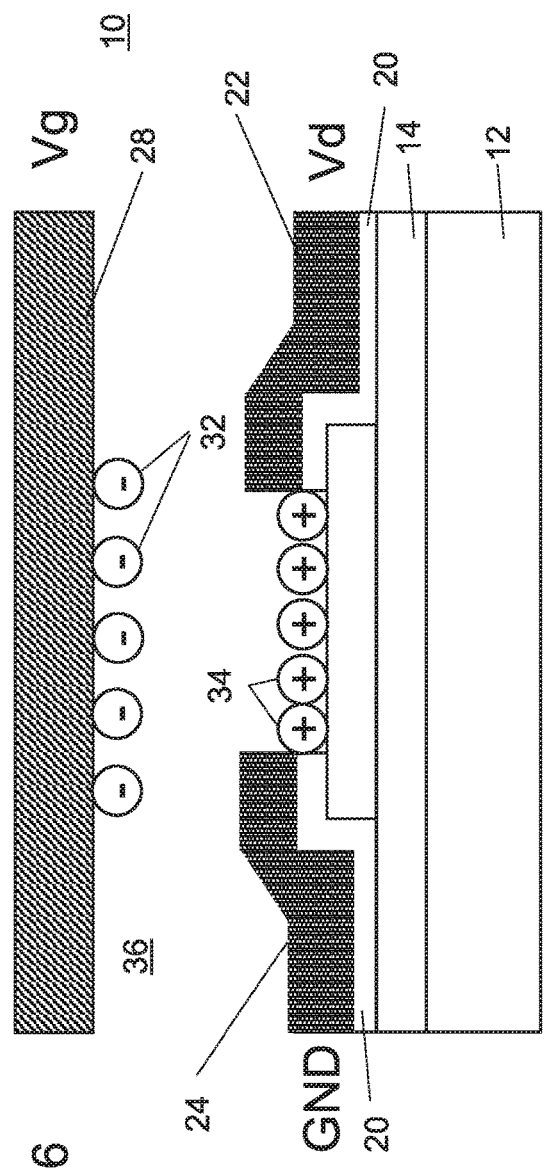

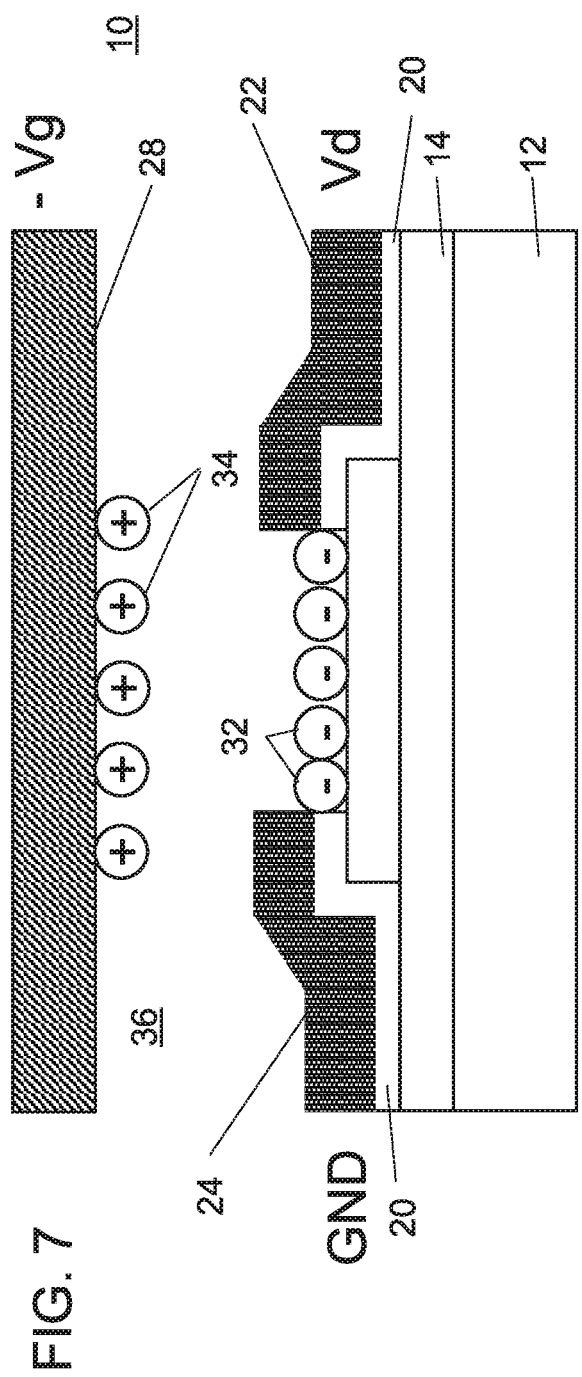

ON-CHIP INTEGRATED TEMPERATURE PROTECTION DEVICE BASED ON GEL ELECTROLYTE

BACKGROUND

Technical Field

The present invention generally relates to semiconductor devices, and more particularly to devices, methods of fabrication and methods of use to protect the devices during high temperature operation.

Description of the Related Art

Semiconductor devices are often employed in high temperature environments, which can be detrimental to their performance and operation. Semiconductor devices can be employed in solar panels, in engine compartments of vehicles, in boilers, etc. These environments can cause failure or at least influence chip lifetime and/or chip integrity.

SUMMARY

In accordance with an embodiment of the present invention, a field effect transistor includes an exposed channel region disposed between a source region and a drain region. A gate electrode is disposed over the exposed channel region. An electrolyte gel is disposed between the gate electrode and the exposed channel region, wherein ions are immobilized in the electrolyte gel below a transition temperature and mobilized above the transition temperature to increase device resistance.

Another field effect transistor includes a substrate, a channel region formed on or in the substrate, a source region formed on one end of the channel region and a drain region formed on a second end of the channel region, wherein a portion of the channel region between the source and drain regions remains exposed to form an exposed channel region. A gate electrode is disposed over and spaced apart from the channel region to form a space. An electrolyte gel is disposed within the space between the gate electrode and the exposed channel region, wherein ions are immobilized in the electrolyte gel below a transition temperature and mobilized above the transition temperature to increase device resistance.

A method for fabricating a field effect transistor with temperature protection includes forming a transistor device having an exposed channel region disposed between a source region and a drain region; forming a gate electrode disposed over the exposed channel region; and filling an electrolyte gel between the gate electrode and the exposed channel region where ions are immobilized in the electrolyte gel below a transition temperature and mobilized above the transition temperature to increase device resistance.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 3 is a cross-sectional view showing the semiconductor device of FIG. 2 having a gate electrode formed over the exposed region of the semiconductor layer in accordance with an embodiment of the present invention;

FIG. 4 is a cross-sectional view showing the semiconductor device of FIG. 3 having an electrolyte gel with randomly dispersed ions formed between the gate electrode and the exposed region of the semiconductor layer in accordance with an embodiment of the present invention;

FIG. 5 is a cross-sectional view showing the semiconductor device of FIG. 4 having the ions of the electrolyte gel aligned on the gate electrode and on the exposed region of the semiconductor layer to increase resistance of the device in accordance with an embodiment of the present invention;

FIG. 6 is a cross-sectional view showing the semiconductor device of FIG. 5 having the ions of the electrolyte gel aligned on the gate electrode and on the exposed region of the semiconductor layer to increase resistance of the device using a gate voltage (Vg) on the gate electrode in accordance with an embodiment of the present invention;

FIG. 7 is a cross-sectional view showing the semiconductor device of FIG. 6 having the ions of the electrolyte gel reversed between the gate electrode and the exposed region of the semiconductor layer to reset the device in normal mode using a reversed gate voltage (e.g., −Vg) on the gate electrode in accordance with an embodiment of the present invention.

DETAILED DESCRIPTION

Figure 1:
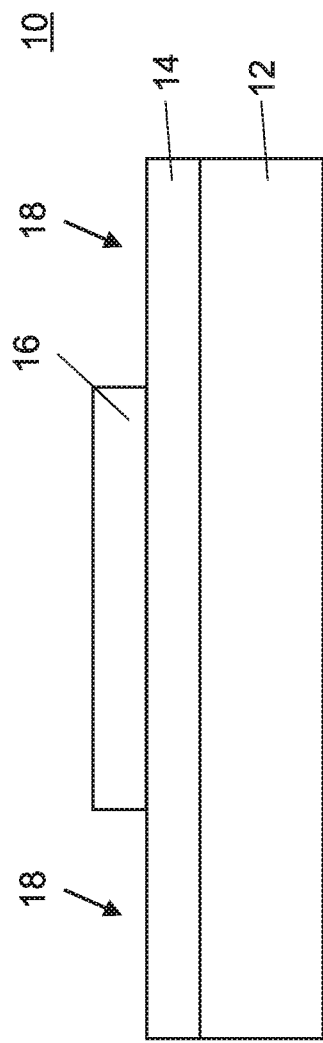
FIG. 1 is a cross-sectional view showing a patterned semiconductor layer (channel region) on a semiconductor on insulator substrate in accordance with an embodiment of the present invention.

Methods and structures are described that provide operating temperature sensitivity for integrated circuit (IC) chips. The structures are provided on devices to sense a change in temperature and react by increasing thermal resistance of a channel or protective layer. The change in thermal resistance can be over several orders of magnitude if the temperature is over a certain threshold value. The change in resistance protects chip lifetime and integrity.

In one embodiment, a metal oxide semiconductor device can be protected from high temperature using a gel electrolyte as a gate dielectric. The gel electrolyte can include a glass transition temperature. Below the glass transition temperature, the device functions under normal operating conditions. The gel acts as a gate dielectric material for a field effect transistor (FET). Once the glass transition is exceeded, the gel becomes an electrolyte and forms a very large electric double-layer capacitance by separating positive and negative charged ions in the gel. With an applied gate voltage, double-layer capacitance can be employed to turn the device on or off. The double-layer capacitance can be inverted to restore normal operations once the temperature is reduced below the glass transition temperature.

It is to be understood that aspects of the present invention will be described in terms of a given illustrative architecture;

however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well as any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms e intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a partially fabricated device 10 is illustratively shown in accordance with one embodiment. The device 10 in the illustrative embodiment includes a semiconductor on insulator (SOI or SeOI) substrate. The substrate includes a bulk or base substrate 12, a buried dielectric 14 and a semiconductor layer 16.

In one example, the bulk substrate 12 includes a silicon-based material, such as, e.g., Si, SiGe, SiGeC, SiC, polysilicon, e.g., polySi, epitaxial silicon (epi-Si), amorphous Si (α:Si), and multi-layers thereof. Although silicon is the predominantly used semiconductor material in wafer fabrication, alternative semiconductor materials can be employed, such as, but not limited to, germanium, gallium arsenide, gallium nitride, silicon germanium, carbon nanotubes, molybdenum disulfide, cadmium telluride and zinc selenide.

The buried dielectric layer 14 can include an oxide, such as silicon oxide, although other dielectric materials can be employed. Such dielectric materials can include high-k oxides, nitrides, such as, silicon nitrides, silicate glasses, etc.

The semiconductor layer 16 can also include a silicon-based material, such as, e.g., Si, SiGe, SiGeC, SiC, polysilicon, e.g., polySi, epitaxial silicon (epi-Si), amorphous Si (α:Si), and multi-layers thereof. The semiconductor layer 16 can include a monocrystalline form of material, polycrystalline form of material or amorphous form of material depending on the device structure to provide a device channel for a FET formed using the semiconductor layer 16. Although silicon is the predominantly used semiconductor material in wafer fabrication, alternative semiconductor materials can be employed, such as, but not limited to, germanium, gallium arsenide, gallium nitride, silicon germanium, carbon nanotubes, molybdenum disulfide, cadmium telluride and zinc selenide. In other embodiments, the substrate 12 can include glass, ceramic, plastic, quartz, etc.

In one embodiment, the semiconductor layer 16 is patterned using a patterning technique. Such patterning techniques can include lithography, spacer image transfer or any other suitable technique. The patterning removes the semiconductor layer 16 in regions 18 to electrically isolate neighboring devices from each other.

Figure 2:
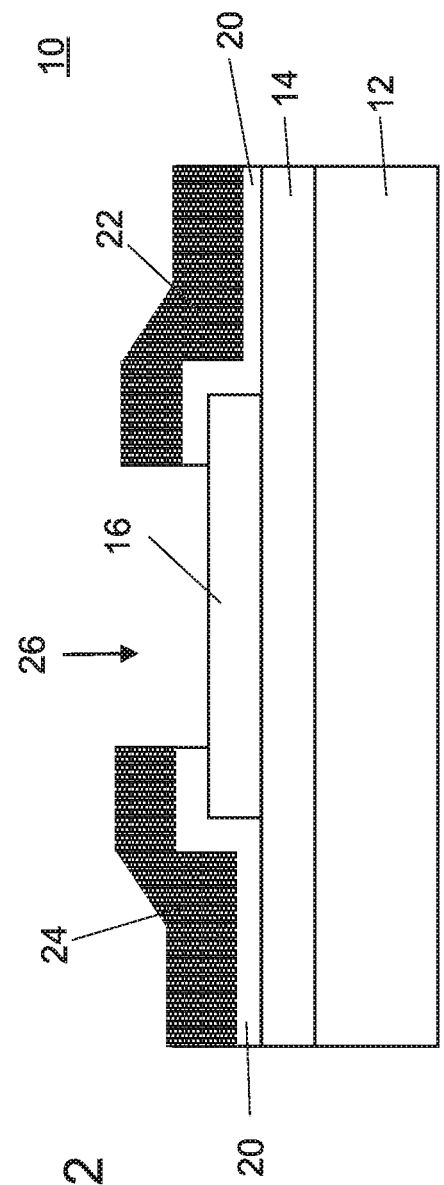
FIG. 2 is a cross-sectional view showing the semiconductor device of FIG. 1 having barrier layers and source and drain regions formed to provide an exposed region of the semiconductor layer in accordance with an embodiment of the present invention.

Referring to FIG. 2, a barrier layer 20 is formed over the semiconductor layer 16. The barrier layer 20 can include a metal, e.g., Ni, Mo, Ti, Ta, or combination of materials, such as e.g., NiSi, PtSi, etc. The barrier layer 20 can be formed by chemical vapor deposition (CVD), atomic layer deposition (ALD), plasma enhanced CVD (PECVD), sputtering, evaporation or any other suitable process. A source/drain (S/D) layer (22, 24) is formed by CVD, ALD, PECVD, sputtering, evaporation or any other suitable process. The S/D layer 22, 24 can include one or more metal layers, e.g., Au, Ta, Mo, Al, W or combination or these or other materials, (e.g., Mo/Al/Mo, MoW, etc.). In other embodiments, the S/D regions 22, 24 can include doped semiconductor materials, e.g., Si, poly Si, etc.

The barrier layer 20 and the S/D layer 22, 24 are patterned to open up an area 26 over the semiconductor layer 16. The patterning process can include a photolithography process with anisotropic etching. The patterning process forms a source 24 and a drain 22. The source 24 and drain 22 regions can be juxtaposed in other embodiments.

The structure of device 10 can include a thin film transistor (TFT) structure although any field effect transistor structure can be employed. For example, finFET structures, planar structures, vertical FETs, nanowires, etc. can all be employed in accordance with aspects of the present invention. It should be understood that while a specific structure is depicted, other structures can be employed and include temperature protection as will be described.

Referring to FIG. 3, a top gate or gate conductor or electrode 28 is formed. The top gate 28 can include a metal or other conductive material. In one embodiment, the gate 28 can include, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), a transparent conductor (e.g., indium tin oxide (ITO), indium zinc oxide (IZO), zinc oxide (ZnO), etc.), carbon nanotubes, conductive carbon, graphene, or any suitable material or combination of materials. The gate 28 can further comprise dopants that are incorporated during or after deposition. The gate 28 can include coatings or other layers that protect or isolate the gate (e.g., dielectric materials, rubbed layers, etc.).

The gate 28 is spaced apart by space 30 from the exposed semiconductor layer 16 (device channel). The gate 28 can be formed on spaced apart using one or more dielectric layers or a seal layer or gasket formed about a periphery on the device 10 or in a more local area around the device 10. The gate 28 can be formed on a dielectric layer(s), and the dielectric layer(s) are subsequently removed from below the gate electrode 28 by an etch process. A seal (not shown) can be formed about the gate electrode 28 to close off the spacer 30 for the introduction of a gel or liquid material. The seal can include a seal employed in liquid crystal display technologies.

Referring to FIG. 4, the space 30 is filled with an electrolyte gel 36. No voltage is applied during fabrication or gel filling. The gel 36 is cooled down to a temperature below the glass transition temperature. The gel 36 includes an insulator.

The gel 36 includes negatively charged ions 32 and positively charged ions 34 that are dissociated within the gel 36. During fabrication, the ions 32, 34 are randomly distributed throughout the gel 36. The gel 36 can fill the space 30 using fill processes employed with, e.g., liquid crystal display technology. The gel 36 includes a flowable dielectric material having an ion source within the gel 26 that is reactive to an electric field. In some embodiments, the gel 26 can include polyvinyl alcohol (PVA), ethylene carbonate, propylene carbonate, poly(acylonitrile), other dielectric gels or combinations of these and other materials. In one embodiment, the ions 32, 34 can include dissociated lithium perchlorate ($LiClO_4$) or other strong electrolyte. With $LiClO_4$, the negatively charged ions 32 include perchlorate ($ClO_4^-$) ions, and the positively charged ions 34 include Li+ ions.

FIG. 4 shows a configuration for normal operation (normal mode) of the FET device 10. The ions 32, 34 are distributed in the dielectric gel 36. The dielectric gel 36 acts as a gate dielectric between the gate electrode 28 and the semiconductor layer 16. Normal operation is conducted when an ambient temperature (e.g., the temperature in the vicinity of the device 10) is below the glass transition temperature of the gel 26. In one example, the gel 36 includes PVA with lithium perchlorate ions 32, 34. In the example, a glass transition temperature is about 80 degrees C. for PVA. Therefore, normal operation occurs below this temperature.

The device 10 is switched on and off in accordance with a threshold voltage applied to the gate electrode 28. The gel 36 acts as a gate dielectric so the device can provide standard metal oxide semiconductor field effect transistor (MOSFET) operation.

Below the glass transition temperature, the ions 32, 34 become immobilized and the gel 36 acts as a dielectric. The applied gate bias will not affect device operation since the gate capacitance is very small with about a micron thick gate dielectric (gel 36).

Referring to FIG. 5, if the temperature of the device 10 increases above the glass transition temperature, e.g., about 80 degrees C. for PVA:LiClO$_4$, the gel electrolyte 36 can provide a very large electric double-layer capacitance resulting from a large dielectric constant of the gel 36 and short Debye lengths. The double-layer capacitance can occur using a small gate voltage such that with a temperature over the glass transition temperature, the gel 36 becomes an electrolyte and forms a very large electric double-layer capacitance. In one embodiment, the double layer capacitance includes free movement of the ions or electrolytes 32, 34 within the gel 36. The gel 36 has a thickness dimension of, e.g., between about 0.5 to about 1.5 microns.

Referring to FIG. 6, in one example, the gate 28 receives a positive gate voltage (a small Vg for biasing not the device threshold voltage). This attracts the negative ions 32, which align at the gate 28, and repulses the positive ions 34, which collect on the semiconductor layer 16 (device channel). With application of the small gate voltage, the device 10 can be turned on or off until the presence of charge along the gate 28 and the semiconductor layer 16 occurs to cause changes in the device resistance. The small gate voltage (Vg) can be applied to the gate electrode 28, with a drain voltage (Vd) on drain 22, and the source connected to ground (GND).

In normal operation, since the chip temperature is below the glass transition temperature of the gel 36, the gel 36 is an insulator. The applied small Vg will not affect the device operation, and the device 10 cannot be switched on or off in accordance with the voltage on the gate 28 based on the small Vg bias voltage.

If the chip temperature is above the glass transition temperature of the gel 36 in protection mode, the gel 36 becomes an electrolyte. Ions 32, 34 can move under the applied small Vg and can effectively change the device status to trigger a double capacitance layer self-protection mechanism. This mechanism could either intentionally increase or decrease the resistance of the device 10 by many orders of magnitude to trigger protection circuitry to protect the chip at high temperatures. The increase or decrease the resistance of the device 10 can be selected based on ion concentration, gel thickness, device properties, etc. The resistance of the device 10 can be employed as a trigger for a protection circuit (not shown) that can be triggered in accordance with the temperature state of the device. Standard protection devices can be employed. In another embodiment, the resistance of the device 10 itself can be employed to protect the device 10.

Referring to FIG. 7, after the device 10 has been cooled down, a reversing process or reset mode can be triggered by an external circuit to apply a reverse or negated gate voltage (e.g., −Vg (for the small bias voltage)) while maintaining the chip at a safe temperature, e.g., slightly above the glass transition temperature of the gel 36. This process will then reverse the device 10 to its original status of lower resistance operation. Then, the device 10 can be cooled down further to normal operating temperatures (e.g., below the glass transition temperature), and the device 10 can function with a temperature protection mechanism.

Figure 8:
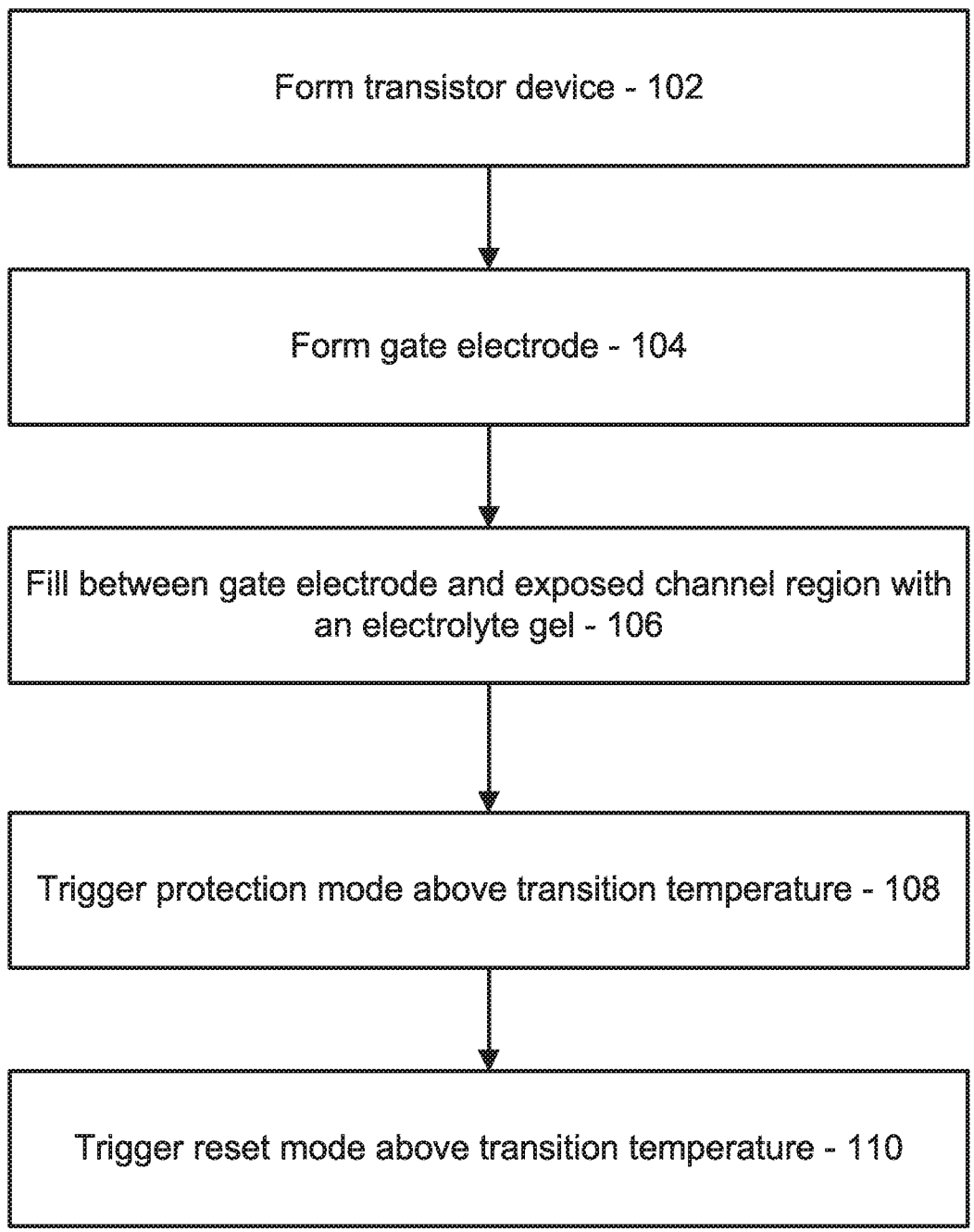
FIG. 8 is a block/flow diagram showing methods for fabricating a field effect transistor with temperature protection in accordance with an embodiment of the present invention.

Referring to FIG. 8, methods for fabricating a field effect transistor with temperature protection are illustratively shown. In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a transistor device is formed having an exposed channel region disposed between a source region and a drain region. In block 104, a gate electrode is formed and is disposed over the exposed channel region. In block 106, an electrolyte gel fills between the gate electrode and the exposed channel region where ions are immobilized in the electrolyte gel below a transition temperature and mobilized above the transition temperature to increase device resistance. The electrolyte gel can include a polyvinyl alcohol with ions of lithium perchlorate.

In block 108, a protection mode is triggered automatically by a temperature above the transition temperature. The normal mode initially includes ions randomly dispersed through the electrolyte gel, and the protection mode includes ions of a first conductivity aligning along the gate electrode and ions of a second conductivity aligning along the exposed channel region to form a double-layer capacitance to increase the device resistance. A temperature protection mechanism can be triggered and employed in the protection mode, or the device itself can render the device or other devices in the protection mode.

In block 110, a reset mode is triggered to reverse ion positions in accordance with a reversed gate voltage to restore the normal mode. The reset mode is performed above the transition temperature.

Having described preferred embodiments for an on-chip integrated temperature protection device based on gel electrolyte (which are intended to be illustrative and not limiting), it is noted that modifications and variations can be made by persons skilled in the art in light of the above teachings. It is therefore to be understood that changes can be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A field effect transistor, comprising:
   an exposed channel region disposed between a source region and a drain region;
   a gate electrode disposed over the exposed channel region; and
   a gel disposed between the gate electrode and the exposed channel region, wherein the gel includes ions distributed throughout the gel and the gel is configured so that ions are immobilized in the gel below a transition temperature and mobilized above the transition temperature to increase device resistance.

2. The transistor as recited in claim 1, wherein the gel includes a polyvinyl alcohol.

3. The transistor as recited in claim 1, wherein the ions include ions of lithium perchlorate.

4. The transistor as recited in claim 1, wherein the transistor includes a normal mode and a protection mode, wherein the protection mode is triggered by a temperature above the transition temperature.

5. The transistor as recited in claim 4, wherein the normal mode initially includes ions randomly dispersed through the gel.

6. The transistor as recited in claim 4, wherein the protection mode includes ions of a first conductivity aligning along the gate electrode and ions of a second conductivity aligning along the exposed channel region to form a double-layer capacitance to increase the device resistance.

7. The transistor as recited in claim 6, wherein the transistor further includes a reset mode to reverse ion positions in accordance with a reversed gate voltage to restore the normal mode.

8. A field effect transistor, comprising:
a substrate;
a channel region formed on or in the substrate;
a source region formed on one end of the channel region;
a drain region formed on a second end of the channel region, wherein a portion of the channel region between the source and drain regions remains exposed to form an exposed channel region;
a gate electrode disposed over and spaced apart from the channel region to form a space;
a gel disposed within the space between the gate electrode and the exposed channel region, wherein the gel includes ions distributed throughout the gel and the gel is configured so that the ions are immobilized in the gel below a transition temperature and mobilized above the transition temperature to increase device resistance.

9. The transistor as recited in claim 8, wherein the gel includes a polyvinyl alcohol.

10. The transistor as recited in claim 8, wherein the ions include ions of lithium perchlorate.

11. The transistor as recited in claim 8, wherein the transistor includes a normal mode and a protection mode, wherein the protection mode is triggered by a temperature above the transition temperature.

12. The transistor as recited in claim 11, wherein the normal mode initially includes ions randomly dispersed through the gel.

13. The transistor as recited in claim 11, wherein the protection mode includes ions of a first conductivity aligning along the gate electrode and ions of a second conductivity aligning along the exposed channel region to form a double-layer capacitance to increase the device resistance.

14. The transistor as recited in claim 13, wherein the transistor further includes a reset mode to reverse ion positions in accordance with a reversed gate voltage to restore the normal mode.

15. A method for fabricating a field effect transistor with temperature protection, comprising:
forming a transistor device having an exposed channel region disposed between a source region and a drain region;
forming a gate electrode disposed over the exposed channel region; and
filling a gel between the gate electrode and the exposed channel region wherein the gel includes ions distributed throughout the gel and the gel is configured so that the ions are immobilized in the gel below a transition temperature and mobilized above the transition temperature to increase device resistance.

16. The method as recited in claim 15, wherein the gel includes a polyvinyl alcohol with ions of lithium perchlorate.

17. The method as recited in claim 15, wherein the transistor includes a normal mode and a protection mode, wherein the protection mode is triggered by a temperature above the transition temperature.

18. The method as recited in claim 17, wherein the normal mode initially includes ions randomly dispersed through the gel and the protection mode includes ions of a first conductivity aligning along the gate electrode and ions of a second conductivity aligning along the exposed channel region to form a double-layer capacitance to increase the device resistance.

19. The method as recited in claim 18, further comprising a reset mode to reverse ion positions in accordance with a reversed gate voltage to restore the normal mode.

20. The method as recited in claim 19, wherein the reset mode is performed above the transition temperature.

* * * * *